US010221492B2

(12) United States Patent
Yang et al.

(10) Patent No.: US 10,221,492 B2
(45) Date of Patent: Mar. 5, 2019

(54) ELECTROCATALYST FOR ACIDIC MEDIA AND METHOD OF MAKING AN ELECTROCATALYST FOR ACIDIC MEDIA

(71) Applicant: The Board of Trustees of the University of Illinois, Urbana, IL (US)

(72) Inventors: Hong Yang, Champaign, IL (US); Jaemin Kim, Champaign, IL (US); Pei-Chieh Shih, Champaign, IL (US); Yao Qin, Shanghai (CN)

(73) Assignee: The Board of Trustees of the University of Illinois, Urbana, IL (US)

( * ) Notice: Subject to any disclaimer, the term of this patent is extended or adjusted under 35 U.S.C. 154(b) by 169 days.

(21) Appl. No.: 15/157,808

(22) Filed: May 18, 2016

(65) Prior Publication Data

US 2016/0340791 A1    Nov. 24, 2016

Related U.S. Application Data

(60) Provisional application No. 62/164,371, filed on May 20, 2015.

(51) Int. Cl.
*B01J 23/00* (2006.01)
*C25B 11/04* (2006.01)
(Continued)

(52) U.S. Cl.
CPC .......... *C25B 11/0447* (2013.01); *C01G 55/00* (2013.01); *C25B 1/04* (2013.01);
(Continued)

(58) Field of Classification Search
USPC .......................... 502/100, 300, 302
See application file for complete search history.

(56) References Cited

U.S. PATENT DOCUMENTS

| 8,409,543 B2 * | 4/2013 | Sato ................... H01M 4/9025 |
| | | 423/594.13 |
| 2011/0226634 A1 * | 9/2011 | Bhavaraju ................ C25B 1/13 |
| | | 205/621 |

(Continued)

OTHER PUBLICATIONS

Ma et al., Electrochemica Acta 133 (2014) 391-398.*

(Continued)

*Primary Examiner* — James E McDonough
(74) *Attorney, Agent, or Firm* — Brinks Gilson & Lione

(57) ABSTRACT

An oxygen evolution reaction (OER) electrocatalyst for acidic media comprises a metal oxide structure comprising a pyrochlore phase of chemical formula $A_2B_2O_n$, wherein A comprises one or more A-site metals, B comprises one or more B-site metals, and $6.0 \leq n \leq 7.3$. The metal oxide structure exhibits a mass current density of at least about 20 A/g at an over-potential of 0.22 V in 0.1 M $HClO_4$. According to another embodiment, an electrocatalyst for acidic media comprises a porous metal oxide structure having particulate walls separating a plurality of pores, where each particulate wall comprises interconnected primary particles. The porous metal oxide structure comprises a pyrochlore phase of chemical formula $A_2B_2O_n$, wherein A comprises one or more A-site metals, B comprises one or more B-site metals, and $6.0 \leq n \leq 7.3$.

20 Claims, 5 Drawing Sheets

(51) Int. Cl.
| | |
|---|---|
| C25B 1/04 | (2006.01) |
| C30B 5/00 | (2006.01) |
| C30B 29/22 | (2006.01) |
| C01G 55/00 | (2006.01) |
| B01J 21/00 | (2006.01) |
| B01J 25/00 | (2006.01) |
| B01J 29/00 | (2006.01) |
| B01J 23/10 | (2006.01) |

(52) U.S. Cl.
CPC ...... *C25B 11/0405* (2013.01); *C25B 11/0415* (2013.01); *C30B 5/00* (2013.01); *C30B 29/22* (2013.01); *C01P 2002/36* (2013.01); *C01P 2002/72* (2013.01); *C01P 2004/03* (2013.01); *C01P 2004/04* (2013.01); *C01P 2004/61* (2013.01); *C01P 2004/62* (2013.01); *C01P 2004/64* (2013.01); *C01P 2006/16* (2013.01); *C01P 2006/40* (2013.01); *Y02E 60/366* (2013.01)

(56) References Cited

U.S. PATENT DOCUMENTS

| | | | | |
|---|---|---|---|---|
| 2011/0281111 | A1* | 11/2011 | Subramanian | B82Y 30/00 428/401 |
| 2015/0118592 | A1 | 4/2015 | Allebrod et al. | |

OTHER PUBLICATIONS

Avdeev, M. et al., "Static disorder from lone-pair electrons in $Bi_{2-x}M_xRu_2O_{7-y}$ (M=Cu, Co; x=0, 0.4) pyrochlores", *Journal of Solid State Chemistry*, 169 (2002) pp. 24-34.

Cava, R. J., "Schizophrenic Electrons in Ruthenium-Based Oxides", *Dalton Trans.*, 19 (2004) pp. 2979-2987 (Abstract only).

Dau, Holger et al., "The Mechanism of Water Oxidation: From Electrolysis via Homogeneous to Biological Catalysis", *ChemCatChem*, 2 (2010) pp. 724-761.

Lee, Youngmin et al., "Synthesis and Activities of Rutile $IrO_2$ and $RuO_2$ Nanoparticles for Oxygen Evolution in Acid and Alkaline Solutions", *The Journal of Physical Chemistry Letters*, 3 (2012) pp. 399-404.

Frydendal, R. et al., "Toward an Active and Stable Catalyst for Oxygen Evolution in Acidic Media: Ti-Stabilized $MnO_2$", *Adv. Energy Mater.*, 5 (2015) 1500991, pp. 1-9.

Grimaud, Alexis et al., "Double perovskites as a family of highly active catalysts for oxygen evolution in alkaline solution", *Nat. Commun.*, 4, 2439 (2013) pp. 1-7.

Hackwood, S. et al., "Anodic Evolution of Oxygen on Sputtered Iridium Oxide Films", *J. Electrochem. Soc.*, 128, 12 (1981) pp. 2569-2573.

Horowitz, H. S. et al., "The Synthesis and Electrocatalytic Properties of Nonstoichiometric Ruthenate Pyrochlores", *ACS Symposium Series*, 279 (1985) pp. 143-163.

Ishii, F. et al., "Electronic Band Structure of the Pyrochlore Ruthenium Oxides $A_2Ru_2O_7$ (A=Bi, Tl and Y)", *J. Phys. Soc. Jpn.*, 69, 2 (2000) pp. 526-531.

Kanno, R. Y. et al., "Crystal Structure and Electrical Properties of the Pyrochlore Ruthenate $Bi_{2-x}Y_xRu_2O_7$", *Journal of Solid State Chemistry*, 102 (1993) pp. 106-114.

Kim, J. et al., "$Ca_2Mn_2O_5$ as Oxygen-Deficient Perovskite Electrocatalyst for Oxygen Evolution Reaction", *Journal of the American Chemical Society*, 136 (2014) pp. 14646-14649.

Kim, Hyunah et al., "Coordination tuning of cobalt phosphates towards efficient water oxidation catalyst", *Nat. Commun.*, 6, 8253 (2015) pp. 1-11.

Kiyono, Hajime et al., "Influence of yttrium component on water corrosion resistance of sodium ion conducting silicate glass", *Ceramics International*, 41 (2015) pp. 10018-10023.

Koo, H. J. et al., "Similarities and Differences in the Structural and Electronic Properties of Ruthenium and Iridium Pyrochlores $A2_2M_2O_{7-y}$ (M=Ru, Ir)", *Journal of Solid State Chemistry*, 136 (1998) pp. 269-273.

Kotz, R. et al., "In-Situ Identification of $RuO_4$ as the Corrosion Product During Oxygen Evolution on Ruthenium in Acid Media", *J. Electroanal. Chem.*, 172 (1984) pp. 211-219.

Lee, K. S. et al., "Structural and Electronic Factors Governing the Metallic and Nonmetallic Properties of the Pyrochlores $A_2Ru_2O_{7-y}$", *Journal of Solid State Chemistry*, 131 (1997) pp. 405-408.

Lee, Michael M. et al., "Efficient Hybrid Solar Cells Based on Meso-Superstructured Organometal Halide Perovskites", *Science*, 338 (2012) pp. 643-647.

Lewis, Nathan S. et al., "Powering the planet: Chemical challenges in solar energy utilization", *Proceedings of the National Academy of Sciences of the United States of America*, 103, 43 (2006) pp. 15729-15735.

Liu, Ming et al., "The influence of yttrium (Y) on the corrosion of Mg—Y binary alloys", *Corrosion Science*, 52 (2010) pp. 3687-3701.

Liu, Mingzhen et al., "Efficient planar heterojunction perovskite solar cells by vapour deposition", *Nature*, 501, 7467 (2013) pp. 395-398.

Loi, Maria Antonietta et al., "Hybrid solar cells: Perovskites under the Sun", *Nature Materials*, 12 (2013) pp. 1087-1089.

Lyons, Michael E. G. et al., "Mechanism of oxygen reactions at porous oxide electrodes. Part 2—Oxygen evolution at $RuO_2$, $IrO_2$ and $Ir_xRu_{1-x}O_2$ electrodes in aqueous acid and alkaline solution", *Phys. Chem. Chem. Phys.*, 13 (2011) pp. 5314-5335.

Man, Isabela C. et al., "Universality in Oxygen Evolution Electrocatalysis on Oxide Surfaces", *ChemCatChem*, 3 (2011) pp. 1159-1165.

McCrory, Charles C. L. et al., "Benchmarking Heterogeneous Electrocatalysts for the Oxygen Evolution Reaction", *Journal of the American Chemical Society*, 135 (2013) pp. 16977-16987.

McCrory, Charles C. L. et al., "Benchmarking Hydrogen Evolving Reaction and Oxygen Evolving Reaction Electrocatalysts for Solar Water Splitting Devices", *Journal of the American Chemical Society*, 137 (2015) pp. 4347-4357.

Miara, Lincoln J. et al., "First-Principles Studies on Cation Dopants and Electrolyte|Cathode Interphases for Lithium Garnets", *Chemistry of Materials*, 27 (2015) pp. 4040-4047.

Mitzi, David B., "Synthesis, Structure, and Properties of Organic-Inorganic Perovskites and Related Materials", *Progress in Inorganic Chemistry*, Edited by Kenneth D. Karlin, 48 (1999) pp. 1-121.

Modeshia, Deena R. et al., "Solvothermal synthesis of perovskites and pyrochlores: crystallisation of functional oxides under mild conditions", *Chemical Society Reviews*, 39 (2010) pp. 4303-4325.

Nong, Hong Nhan et al., "Oxide-Supported $IrNiO_x$ Core-Shell Particles as Efficient, Cost-Effective, and Stable Catalysts for Electrochemical Water Splitting", *Angew. Chem. Int. Ed.*, 54 (2015) pp. 2975-2979.

Oh, Si Hyoung et al., "Oxide Catalysts for Rechargeable High-Capacity Li—$O_2$ Batteries", *Advanced Energy Materials*, 2 (2012) pp. 903-910.

Oh, Si Hyoung et al., "Synthesis of a metallic mesoporous pyrochlore as a catalyst for lithium-$O_2$ batteries", *Nat. Chem.*, 4 (2012) pp. 1004-1010.

Park, Nam-Gyu, "Organometal Perovskite Light Absorbers Toward a 20% Efficiency Low-Cost Solid-State Mesoscopic Solar Cell", *J. Phys. Chem. Lett.*, 4 (2013) pp. 2423-2429.

Park, Sehkyu et al., "Oxygen electrocatalysts for water electrolyzers and reversible fuel cells: status and perspective", *Energy & Environmental Science*, 5 (2012) pp. 9331-9344.

Parrondo, Javier et al., "Pyrochlore electrocatalysts for efficient alkaline water electrolysis", *J. Mater. Chem. A*, 3 (2015) pp. 10819-10828.

Rossmeisl, J. et al., "Electrolysis of water on (oxidized) metal surfaces", *Chemical Physics*, 319 (2005) pp. 178-184.

Rossmeisl, J. et al., "Electrolysis of water on oxide surfaces", *Journal of Electroanalytical Chemistry*, 607 (2007) pp. 83-89.

(56) References Cited

OTHER PUBLICATIONS

Ryll, T. et al., "Electrical conductivity and crystallization of amorphous bismuth ruthenate thin films deposited by spray pyrolysis", *Physical Chemistry Chemical Physics*, 12 (2010) pp. 13933-13942.

Sardar, Kripasindhu et al., "Water-Splitting Electrocatalysis in Acid Conditions Using Ruthenate-Iridate Pyrochlores", *Angew. Chem.*, 126 (2014) pp. 11140-11144.

Sardar, Kripasindhu et al., "Water-Splitting Electrocatalysis in Acid Conditions Using Ruthenate-Iridate Pyrochlores", *Angew. Chem. Int. Ed.*, 53 (2014) pp. 10960-10964.

Shannon, R. D., "Revised Effective Ionic Radii and Systematic Studies of Interatomic Distances in Halides and Chalcogenides", *Acta Cryst*, A 32 (1976) pp. 751-767.

Song, Shidong et al., "Electrochemical investigation of electrocatalysts for the oxygen evolution reaction in PEM water electrolyzers", *International Journal of Hydrogen Energy*, 33 (2008) pp. 4955-4961.

Subramanian, M. A. et al., "Oxide Pyrochlores—A Review." *Prog. Solid State Chem.*, 15 (1983) pp. 55-143.

Suntivich, J. et al., "Design principles for oxygen-reduction activity on perovskite oxide catalysts for fuel cells and metal-air batteries", *Nature Chemistry*, 3 (2011) pp. 546-550.

Suntivich, Jin et al., "A Perovskite Oxide Optimized for Oxygen Evolution Catalysis from Molecular Orbital Principles", *Science*, 334 (2011) pp. 1383-1385.

Takeda, T. et al., "Structure-property relationships in pyrochlores: low-temperature structures of $Tl_2Ru_2O_{7-\delta}$ ($\delta=0.00$ and $0.05$)", *Journal of Materials Chemistry*, 9 (1999) pp. 215-222.

Walter, Michael G. et al., "Solar Water Splitting Cells", *Chemical Reviews*, 110, 11 (2010) pp. 6446-6473.

Zhang, Bo et al., "Homogeneously dispersed multimetal oxygen-evolving catalysts", *Science*, 352, 6283 (2016) pp. 333-337.

\* cited by examiner

ELECTROCATALYST FOR ACIDIC MEDIA AND METHOD OF MAKING AN ELECTROCATALYST FOR ACIDIC MEDIA

RELATED APPLICATION

The present patent document claims the benefit of the filing date under 35 U.S.C. § 119(e) of U.S. Provisional Patent Application Ser. No. 62/164,371, filed on May 20, 2015, and hereby incorporated by reference in its entirety.

TECHNICAL FIELD

The present disclosure is related generally to catalysts and more specifically to electrocatalysts for acidic media.

BACKGROUND

Electrocatalysts have been developed for various applications, such as hydrogen generation based on water splitting. Recently, oxides such as perovskites and other inorganic compounds have been studied for this application. Among the advantages of using perovskites and other oxides compared to noble metals such as platinum is reduced cost and structural flexibility. In an $ABO_3$-type (perovskite) structure, both A- and B-sites can be varied by using metal cations with different valences or ionic radii. Partial replacement or doping at these sites is relatively straightforward and may result in a change of chemical, electronic, and physical properties. During the past several years, a series of perovskites have been studied as electrocatalysts for oxygen evolution reaction (OER), which is utilized in water oxidation electrodes in solar-fuel conversion devices to generate hydrogen fuel from water. Typically, the reported OER catalysts are used in alkaline media. In acidic media, the OER may be extremely slow due to a sluggish reaction process, which poses a technological hurdle for producing hydrogen fuel from water. In addition, the currently known OER catalysts also suffer from a lack of stability in acid. However, the acidic condition is important for full solar-fuel devices because a faster, more efficient hydrogen evolution reaction (HER), which occurs at the other half electrochemical cell, can be achieved only in an acid environment.

To date the most successful OER electrocatalysts under acidic conditions are ruthenium oxide ($RuO_2$) and iridium oxide ($IrO_2$), despite of years of research in this area. Although it is attractive due to its high OER catalyst activity, the $RuO_2$ catalyst is oxidized to ruthenium tetroxide ($RuO_4$) in acidic media during use (>1.4V) and $RuO_4$ is readily dissolved into the electrolyte. Thus, the catalyst loses its electrocatalytic activity substantially during the water splitting reaction. On the other hand, while it is highly corrosion resistant (stable at 1.95 V vs. RHE for >240 h in 0.5 M $H_2SO_4$), the $IrO_2$ electrocatalyst has a much lower OER activity than does $RuO_2$. Thus, industrial application of solar-water splitting devices continues to be hindered by the lack of stable electrocatalysts having an OER activity similar to or better than that of $RuO_2$.

BRIEF SUMMARY

An improved electrocatalyst for use in acidic media and a method of making such an electrocatalyst are described herein. The electrocatalyst may be used for OER.

According to one embodiment, the electrocatalyst comprises a porous metal oxide structure having particulate walls separating a plurality of pores, where each particulate wall comprises interconnected primary particles. The porous metal oxide structure comprises a pyrochlore phase of chemical formula $A_2B_2O_n$, wherein A comprises one or more A-site metals, B comprises one or more B-site metals, and $6.0 \le n \le 7.3$.

According to another embodiment, the electrocatalyst comprises a metal oxide structure comprising a pyrochlore phase of chemical formula $A_2B_2O_n$, wherein A comprises one or more A-site metals, B comprises one or more B-site metals, and $6.0 \le n \le 7.3$. The metal oxide structure exhibits a mass current density of at least about 20 A/g at an overpotential of 0.22 V in 0.1 M $HClO_4$.

A method of forming an electrocatalyst comprises: heating a mixture including: (a) at least one first metal salt for forming one or more A-site metals, (b) at least one second metal salt for forming one or more B-site metals, (c) a chelating agent, and (d) a porogen; curing the mixture to form a gel; and heating the gel to form a porous metal oxide structure comprising a pyrochlore phase of chemical formula $A_2B_2O_n$, where A comprises the one or more A-site metals, B comprises the one or more B-site metals, and $6.0 \le n \le 7.3$, thereby forming the electrocatalyst.

DETAILED DESCRIPTION

Newly-developed electrocatalysts based on pyrochlore-structured metal oxides are found to be extremely active and highly stable in acidic solutions. These high-performance electrocatalysts, which may be particularly suitable for OER, are described herein along with a novel, efficient and economically-viable sol-gel fabrication method that avoids the shortcomings of conventional solid-state synthesis techniques. The new fabrication method provides a simple approach to achieve phase-pure porous pyrochlore structures composed of interconnected primary particles having high crystallinity and a nanoscale particle size. The structure and chemistry of the electrocatalysts is described first, followed by the fabrication method and several examples.

The electrocatalysts have a metal oxide structure comprising a pyrochlore phase having a chemical formula $A_2B_2O_n$, where A comprises one or more A-site metals, B comprises one or more B-site metals, and $6.0 \leq n \leq 7.3$. The chemical formula of the pyrochlore phase may alternatively be written as $A_2B_2O_6O'_\delta$, where O is an oxygen bridging the A- and B-site metals, O' is an oxygen bridging neighboring A-site metals, and $0 \leq \delta \leq 1.3$. Such metal oxide structures may thus be referred to as pyrochlores or pyrochlore structures, and they may be advantageously used as OER electrocatalysts.

Figure 1A:
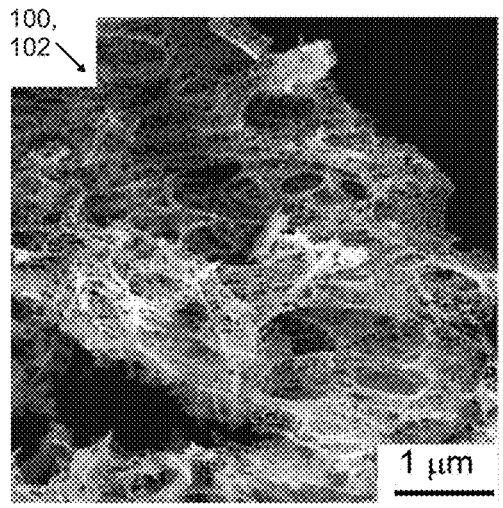
FIGS. 1A and 1B show scanning electron microscope (SEM) images of as-synthesized porous metal oxide structures comprising the pyrochlore phase $Y_2Ru_2O_7$.
Figure 1B:
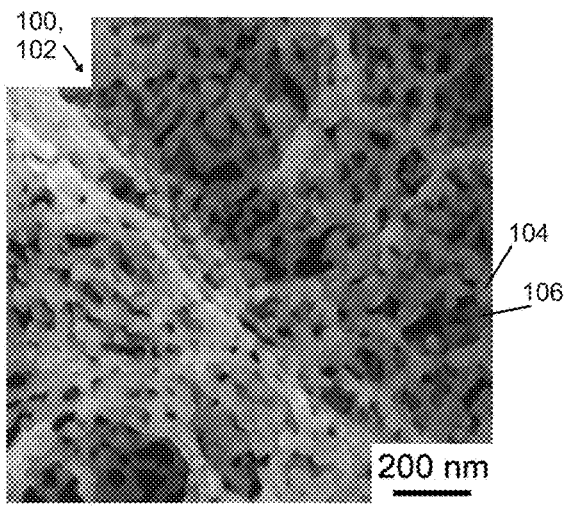
Figure 1C:
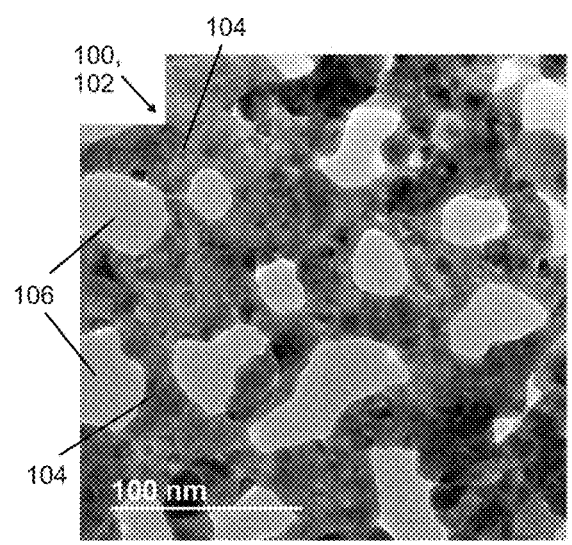
FIGS. 1C and 1D show transmission electron microscope (TEM) images of the porous pyrochlore structures of FIGS. 1A and 1B.
Figure 1D:
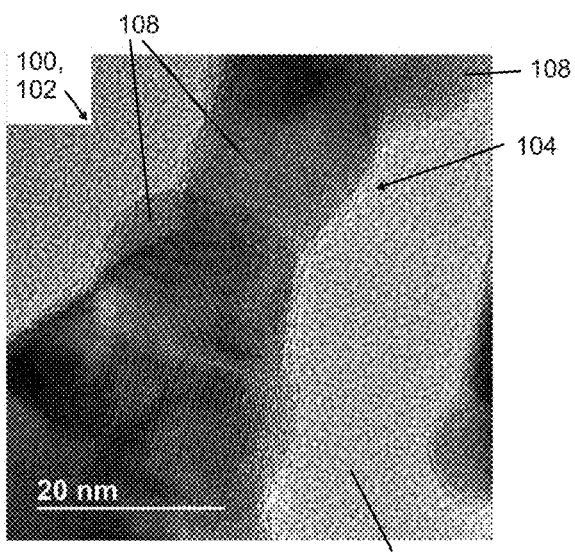

The metal oxide structure may be a porous metal oxide structure, which may be favored for catalytic applications due to its high surface area. Referring to FIGS. 1A-1D, which show electron micrographs of an exemplary porous electrocatalyst 100, the porous metal oxide structure 102 may comprise particulate walls 104 separating a plurality of pores 106, where each particulate wall 104 comprises interconnected primary particles or crystallites 108. FIGS. 1A and 1B show scanning electron microscope (SEM) images and FIGS. 1C and 1D show transmission electron microscope (TEM) images. FIG. 1A reveals a hierarchical porous structure 102 including both microscale and nanoscale porosity, and FIGS. 1B and 1C show the interconnected primary particles 108 that make up the particulate walls 104 surrounding the pores 106. The TEM image of FIG. 1D shows the highly crystalline nature of the particulate walls 104.

The exemplary catalyst 100 of FIGS. 1A-1D has a porous metal oxide structure 102 comprising the pyrochlore phase $Y_2Ru_2O_7$, where the A-site metal is Y, the B-site metal is Ru and n is 7. Another example of a suitable pyrochlore phase is $Y_2Ir_2O_7$, where the A-site metal is Y, the B-site metal is Ir and n is 7. Generally speaking, the A-site metal of the pyrochlore phase may be selected from among Y, Pb, Bi, Tl, Pr, Nd, Sm, Eu, Gd, Tb, Dy, Ho, Er, Tm, Yb, and Lu, and the B-site metal may be selected from between Ru and Ir. Typically, $6.5 \leq n \leq 7$.

The interconnected primary particles may be understood to be sintered primary particles, where the primary particles are single crystalline particles or crystallites. As a consequence of a heat treatment during fabrication of the electrocatalyst (as described below), adjacent primary particles undergo sintering to form the interconnected primary particles that make up the particulate walls. Chemical and/or physical bonds between adjacent primary particles are created during sintering. Thus, the interconnected primary particles are not simply in contact with each other, but rather they are bonded together at contact regions (e.g., necks) between adjacent particles.

Each of the interconnected primary particles may have a crystallite size in the range from about 1 nm to 10 μm. Typically, the average crystallite size is in the nanoscale range (e.g., from about 5 nm to about 500 nm, or from about 5 nm to about 200 nm), and thus the interconnected primary particles may be said to be nanocrystalline. The high surface area-to-volume ratio inherent to nanoscale particles combined with the high porosity inherent to the porous metal oxide structure may be advantageous for electrocatalytic activity. The pores may have an average pore size in the range from about 2 nm to about 1 micron, or from about 2 nm to about 200 nm, or from about 5 nm to about 100 nm.

The porous (or nonporous) metal oxide structure may be a phase-pure structure that includes only the pyrochlore phase $A_2B_2O_n$. As described in the examples below, exceptional stability and performance in acidic media can be obtained for phase-pure electrocatalysts. In some cases, however, the metal oxide structure may include the pyrochlore phase in conjunction with a small amount (e.g., about 1-10 wt. %) of a secondary metal oxide phase, which may have the chemical formula $A_2O_3$, $B_2O_3$, $AO_2$, or $BO_2$ (e.g., $RuO_2$ or $Y_2O_3$). The electrocatalyst may further include a carbon support, which may take the form of particulate carbon supporting or dispersed in the porous metal oxide structure. The particulate carbon may include carbon black (e.g., Vulcan carbon XC-72 or Ketjen carbon), graphite, graphene, graphene oxide carbon nanotubes, and/or carbon dots. The particulate carbon may be doped with nitrogen (N) or another element.

The metal oxide structures described herein may have utility as highly acid-stable and extremely active OER electrocatalysts. As described further below, porous pyrochlore electrocatalysts may exhibit a mass current density of at least about 10 A/g at an over-potential of 0.22 V in acidic conditions (e.g., 0.1 M perchloric acid solution). The mass current density of the pyrochlore structure may also be at least about 20 A/g, at least about 40 A/g, at least about 60 A/g, or at least about 80 A/g. The mass current density may also be as high as about 90 A/g or higher (e.g., up to about 100 A/g or higher) at an over-potential of 0.22 V under the aforementioned acidic conditions. For example, a mass current density of 88.8 A/g has been obtained for phase-pure porous $Y_2Ru_2O_7$ at an over-potential of 22 V in 0.1 M $HClO_4$ in the present work. This stability performance is unmatched by existing OER electrocatalysts.

A new method of forming an electrocatalyst, such as those described above and in the examples, is summarized here and described in more detail below. The method entails heating a mixture comprising: (a) at least one first metal salt for forming one or more A-site metals; (b) at least one second metal salt for forming one or more B-site metals; (c) a chelating agent; and (d) a porogen. After heating, the mixture is cured to form a gel, and the gel is heated to form a porous metal oxide structure comprising a pyrochlore phase of chemical formula $A_2B_2O_n$, where A comprises the one or more A-site metals, B comprises the one or more B-site metals, and $6.0 \leq n \leq 7.3$. An electrocatalyst that may be used for OER is thus formed.

The A-site and B-site metals of the pyrochlore phase may be selected as set forth above. The porous metal oxide structure may include particulate walls separating a plurality of pores, where each particulate wall comprises interconnected primary particles, as described above with respect to FIGS. 1A-1D.

The porogen employed in the mixture may be understood to be a substance that releases gas during heating, thereby creating gas bubbles in the mixture. The gas bubbles may define pores in the gel that are retained in the porous metal oxide structure. Suitable porogens may include perchloric acid ($HClO_4$), sulfuric acid ($H_2SO_4$), chlorous acid ($HClO_2$) nitric acid ($HNO_3$) and/or hydrochloric acid (HCl). The chelating agent may be selected from among citric acid, EDTA, glycine, ascorbic acid and polyvinyl acetate. The chelating agent aids in uniformly dispersing the reactants in the mixture, thereby decreasing diffusion path lengths in the fabricated electrocatalyst. In some cases, the method may be carried out without including the porogen in the mixture, in which case a nonporous metal oxide structure comprising the pyrochlore phase may be formed.

One or both of the first and second metal salts may be hydrated. For example, the first and/or second metal salts may include $xH_2O$, where x represents moles and may have a value $0 \leq x \leq 6$. The first metal salt(s) may be selected from among $M(NO_3)_y$, $MCl_y$, and $M(CH_3CO_2)_y$, where $2 \leq y \leq 3$, and where M comprises a lanthanide metal, Y, Tl, Bi or Pb. The second metal salt(s) may be selected from among $RuCl_3$, $IrCl_3$, and $Ru(NO)(NO_3)_x(OH)_y$, where $x+y=3$. By adjusting the ratio between metal cations and the chelating agent, it is possible to obtain phase-pure porous pyrochlores. For example, to produce phase-pure $Y_2Ru_2O_7$, a suitable molar ratio is $Y(NO_3)_3$:$Ru(NO)(NO_3)_x(OH)_y$:citric acid=1:1:4.

Heating the mixture entails exposing the mixture to a temperature above room temperature for, typically, a short time duration, e.g., from 1 minute to 30 minutes. The temperature may be in the range from about 60° C. to about 100° C., or from 70° C. to about 90° C. Curing the mixture to form the gel may entail heating at from 70° C. to about 90° C. for several hours (e.g., from about 3 hours to 24 hours).

Heating the gel may entail exposing the gel to a sintering temperature from about 930° C. to about 1000° C., or from about 930° C. to about 990° C. Typically, the exposure to the sintering temperature occurs in air and may take place for a period from 6 to 18 hours. The method may further include, prior to exposing the gel to the sintering temperature, drying the gel to remove residual water. The drying may occur at room temperature for a time period sufficient for evaporation to occur, or the drying may take place at an elevated temperature (e.g., from about 70° C. to about 90° C.) for a suitable time duration. The drying may take place in a vacuum environment or in air. After drying, the gel may be heated to a pyrolysis temperature sufficient to remove organic and/or nitrate ligands. The pyrolysis temperature may be from about 400° C. to about 800° C., and pyrolysis may be carried out for several hours (e.g., 6 to 18 hours). Some or all of the above-described heating steps (sintering, drying, pyrolyzing) may be carried out in air.

Forming the electrocatalyst may or may not include fabricating a carbon support for the metal oxide structure. If a carbon support is used, the carbon support may be made by mixing together the porous metal oxide structure, particulate carbon and an organic additive, such as tetrahydrofuran. An ion-conductive polymer such as Nafion may also be included in the mixture. The mixing may be carried out by sonication for a time period of 15 to 45 minutes. The particulate carbon may be selected from among carbon black (e.g., Vulcan carbon XC-72 or Ketjen carbon) graphite, graphene, carbon nanotubes, and carbon dots. In some cases, the particulate carbon may be doped with a dopant element such as nitrogen.

Example 1. Synthesis and Characterization of Phase-Pure Porous $Y_2Ru_2O_7$ Electrocatalyst Stoichiometric amounts of $Y(NO_3)_3 \cdot 6H_2O$ (99.9%; 0.0957 g) and $Ru(NO)(NO_3)_x(OH)_y$, where $x+y=3$ (1.6515 g) are mixed in water (5 mL Millipore water), followed by addition of citric acid (99%, 0.2101 g) and perchloric acid (0.1445 g). The mixed solution is heated to 80° C. in about 10 min and cured for about 5 h for gelation. The water is evaporated overnight until a brown gel is formed. The gel is further heated to 600° C. at a rate of 5° C./min and maintained at that temperature for 12 h to remove any organic compounds. The product is then heated to 960° C. in air at a rate of 5° C./min, and maintained at this temperature for 12 h. All of the processing steps described above may be carried out in air. A porous metal oxide structure is thus formed.

Figure 2A:
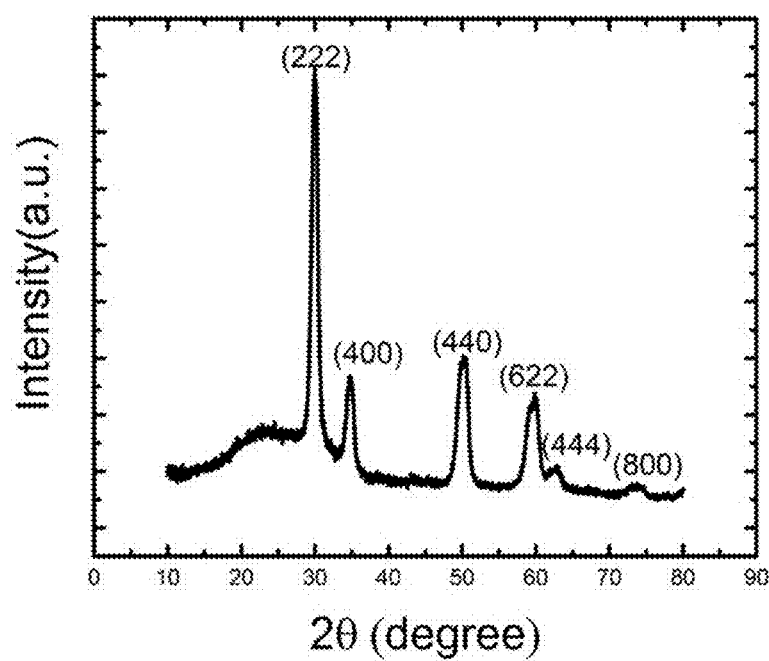
FIG. 2A shows a powder x-ray diffraction pattern (PXRD) pattern obtained from a porous metal oxide structure comprising $Y_2Ru_2O_7$. All of the diffraction peaks can be indexed to the cubic Fd-3m crystal structure, indicating a phase-pure pyrochlore structure.
Figure 2B:
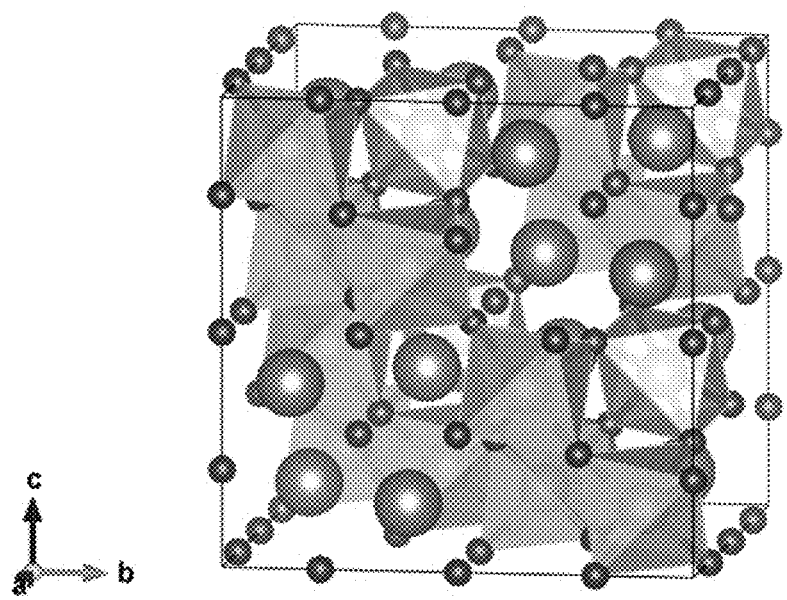
FIG. 2B shows a unit cell of the $Y_2Ru_2O_7$ phase.

Structure and crystal phase analyses of the porous metal oxide structure are conducted using a powder x-ray diffractometer with a Cu x-ray source. The experiment is performed from 10° to 80°, with one second of scanning time at every 0.2°. FIG. 2A shows the powder x-ray diffraction (PXRD) pattern of the as-made porous metal oxide structure. All the diffraction peaks can be indexed to the cubic (Fd-3m) phase $Y_2Ru_2O_7$ (JCPDS No. 01-081-2340). FIG. 2B shows the unit cell of the $Y_2Ru_2O_7$ crystal structure, where the small spheres represent oxygen anions, the large spheres represent yttrium cations, and the medium-size spheres in the center of each octahedron (which are somewhat hidden by the shading) represent the ruthenium cations.

The morphology of the porous pyrochlore structure is studied by TEM and high-resolution TEM (HRTEM) (JEOL 2100 Cryo microscope) at an acceleration voltage of 200 kV. The TEM specimen is prepared by dispersing a suspension comprising the porous pyrochlore structure in ethanol on a carbon-coated copper grid. Scanning electron microscopy (SEM) is carried out on a Hitachi S4700 microscope at 10 kV. The SEM specimen is prepared by dropping the suspension on a piece of silicon wafer. FIGS. 1A and 1B show the SEM images of the porous $Y_2Ru_2O_7$ structure in low and high magnification, respectively. The porous $Y_2Ru_2O_7$ structure includes nanoscale pores and the grain size is between about 10 and 100 nm, on average. FIGS. 1C and 1D show the TEM and HRTEM images of the porous $Y_2Ru_2O_7$ structure. The images reveal nanometer-sized porosity and a single crystalline structure of cubic $Y_2Ru_2O_7$. The crystallinity is high and lattice fringes are clearly visible from center to surface of individual primary particles.

Example 2. Synthesis and Characterization of Porous $Y_2Ru_2O_7$ Electrocatalyst Mixed with Small Amount of $Y_2O_3$ Stoichiometric amounts of $Y(NO_3)_3 \cdot 6H_2O$ (99.9%; 0.0957 g) and $Ru(NO)(NO_3)_x(OH)_y$, where $x+y=3$ (1.6515 g) are mixed in water (5 mL), followed by addition of citric acid (99%, 0.2101 g or 1 mmol) and perchloric acid (70%, veritas double distilled, 0.1445 g). The mixed solution is heated to 80° C. in about 10 min and cured for about 5 h for gelation. The water is evaporated for overnight until a brown gel is formed. The gel is further heated to 600° C. at a rate of 5° C./min and maintained at that temperature for 12 h to remove any organic compounds. The product is then heated to 1000° C. in air at a rate of 5° C./min, and maintained at this temperature for 12 h. All of the processing steps described above may be carried out in air. A porous metal oxide structure is thus formed.

Figure 3:
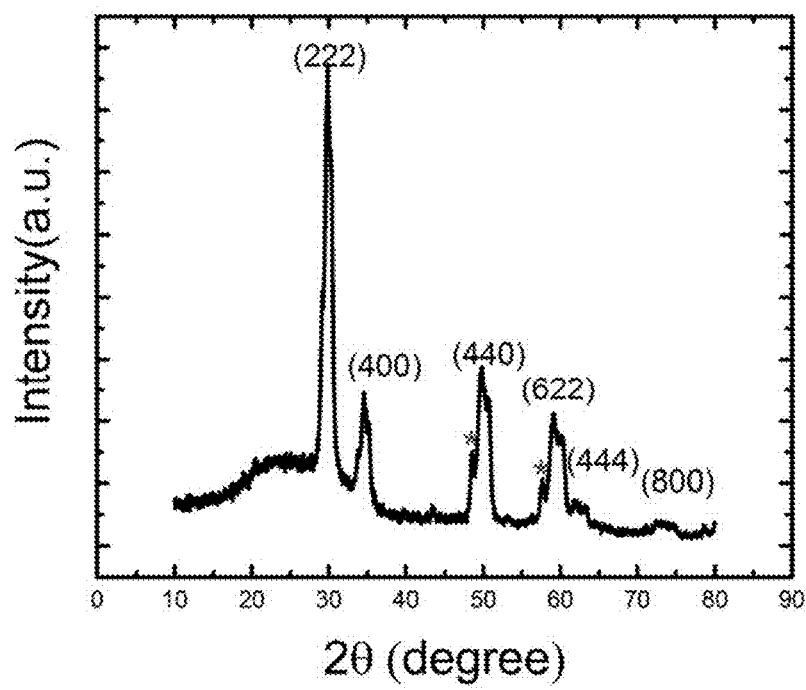
FIG. 3 shows a PXRD pattern from a porous metal oxide structure comprising $Y_2Ru_2O_7$ with a minor amount of $Y_2O_3$.

Structure and crystal phase analyses of the porous metal oxide structure are conducted using a powder x-ray diffractometer with a Cu x-ray source. The scan rate is 0.2° 2θ/second. FIG. 3 shows the PXRD pattern of the as-made porous metal oxide structure. All the main diffraction peaks can be indexed to the cubic (Fd-3m) phase $Y_2Ru_2O_7$ (JCPDS No. 01-081-2340), while the smaller secondary peaks (labeled with stars) correspond to $Y_2O_3$.

Example 3. Electrochemical Testing of Porous $Y_2Ru_2O_7$ Electrocatalyst in Acidic Media Preparation of Carbon-Supported Catalyst Inks:
Vulcan Carbon XC-72 is used as the conducting support for the phase-pure $Y_2Ru_2O_7$ porous metal oxide. 10 mg of $Y_2Ru_2O_7$ prepared as described above is mixed with 2 mg of carbon black in 2 mL of tetrahydrofuran with 3 μL of Na$^+$-Nafion, followed by sonication for 30 min to obtain a homogeneous solution.

Electrocatalytic Measurement:

A three-electrode cell configuration is used. The working electrode is a glassy carbon rotating disk electrode (RDE) with an area of 0.196 cm$^2$. A platinum wire (0.5 mm diameter) connected to a platinum foil (1 cm$^2$ area) is used as the counter electrode. A HydroFlex hydrogen electrode is used as the reference in a separate compartment. 5 μL of the catalyst ink is dropped on the RDE and slowly dried to make a thin film working electrode. The reference electrode is calibrated in H$_2$ (99.999%)-saturated 0.1 M HClO$_4$ (70%, veritas double distilled) solution before the tests. Oxygen evolution reaction (OER) currents are measured in the same HClO$_4$ solution by purging with O$_2$ (99.999%) for at least 30 min before the measurement. Cyclic voltammogram (CV) is recorded between 1.1 V and 1.6 V at a scan rate of 10 mV/s and a rotating speed of 1600 rpm. The OER currents are analyzed by taking the average of positive and negative scans to remove the capacitance effect for OER mass activity. The resistance of the electrolyte is measured in 0.1 M HClO$_4$ solution, and typically equal to 28Ω by the iR compensation method. For the stability test, 1000 cycles are tested between 1.1 V and 1.6 V at a scan rate of 100 mV/s with a rotating speed of 1600 rpm under the same conditions described above.

Figure 4A:
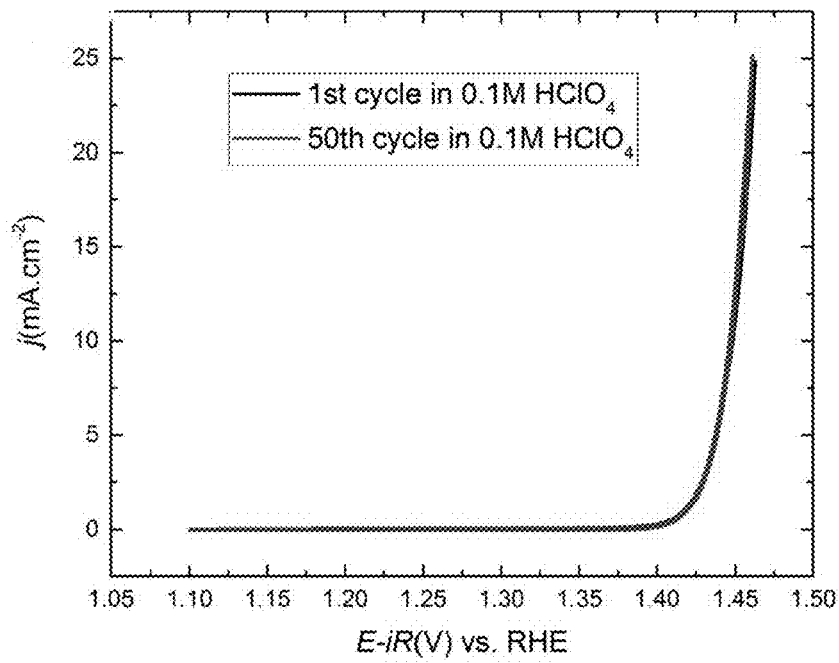
FIG. 4A shows iR-corrected cyclic voltammograms.
Figure 4B:
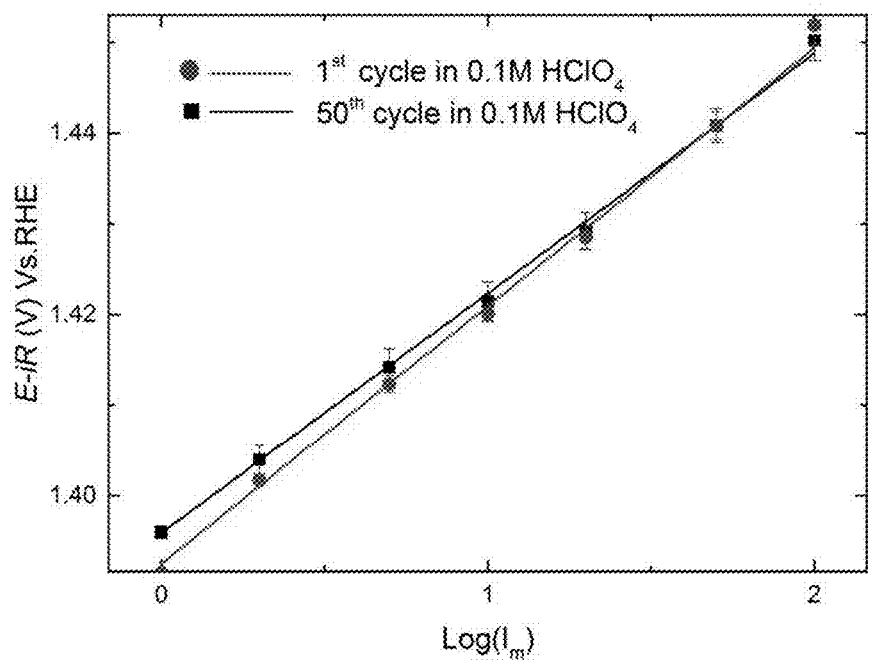
FIG. 4B shows a Tafel plot for an exemplary porous $Y_2Ru_2O_7$ electrocatalyst in a 0.1 M $HClO_4$ solution.

FIG. 4A shows representative iR-corrected cyclic voltammograms of the porous metal oxide structure comprising phase-pure Y$_2$Ru$_2$O$_7$ for OER. The OER currents for the first and the fiftieth scans are not changed during measurement. FIG. 4B shows a Tafel plot for OER mass activities for an exemplary porous Y$_2$Ru$_2$O$_7$ electrocatalyst in a 0.1 M HClO$_4$ solution. The slopes are 28 mV/dec for the first scan and 26 mV/dec for the fiftieth scan, respectively, indicating exceptionally high OER performance in terms of activity and stability. The data show that porous Y$_2$Ru$_2$O$_7$ electrocatalysts may exhibit an onset potential in the range from about 1.40V to about 1.45 V.

Figure 5:
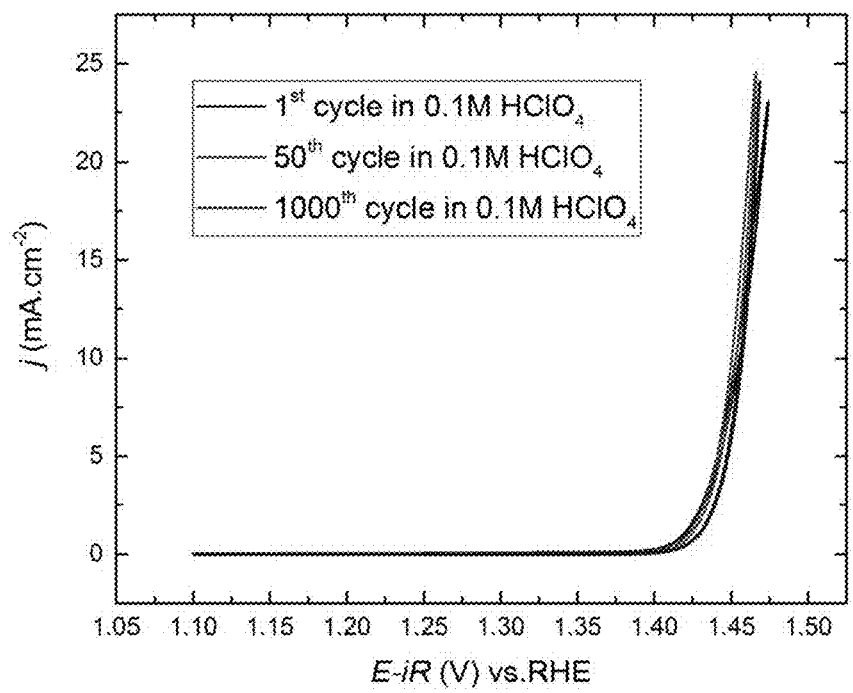
FIG. 5 shows OER data for another exemplary porous $Y_2Ru_2O_7$ electrocatalyst catalyst tested up to 1000 potential cycles in a 0.1 M $HClO_4$ solution, showing exceptional stability and no visible degradation.

The stability of another exemplary porous Y$_2$Ru$_2$O$_7$ electrocatalyst is tested up to 1000 potential cycles, as shown in FIG. 5. The data confirm the high activity and stability of the electrocatalyst without loss of performance over 1000 cycles in an acidic (0.1 M HClO$_4$) solution.

Example 4. Synthesis and Characterization of Nonporous Y$_2$Ru$_2$O$_7$ Electrocatalyst Stoichiometric amounts of Y(NO$_3$)$_3$·6H$_2$O (99.9%; 0.1915 g) and Ru(NO)(NO$_3$)$_x$(OH)$_y$, where x+y=3 (3.303 g) are mixed in water (10 mL), followed by addition of citric acid (99%, 0.4203 g). The mixed solution is heated to 80° C. in about 10 min and cured for about 5 h for gelation. The water is evaporated overnight until a brown gel is formed. The water from the gel is fully removed at 120° C. for at least 4 h in a vacuum oven (about 10 mm Hg) and the gel is further heated to 600° C. at a rate of 5° C./min and maintained at that temperature for 6 h to remove any organic compounds. The dark grey colored product is then heated to 1000° C. at a rate of 5° C./min, and maintained at this temperature for 12 h. The structure and crystal phase analyses of the obtained solid product is conducted using a powder x-ray diffractometer with a Cu x-ray source. The experiment is performed in transmission detection mode from 5° to 100°, with 3 minutes scanning time at every 5°. PXRD patterns indicate that the metal oxide structure comprises phase-pure Y$_2$Ru$_2$O$_7$ (JCPDS No. 01-081-2340). Since perchloric acid was not employed in the synthesis, this Y$_2$Ru$_2$O$_7$ specimen does not have a porous structure, and may be referred to as nonporous Y$_2$Ru$_2$O$_7$.

Figure 6:
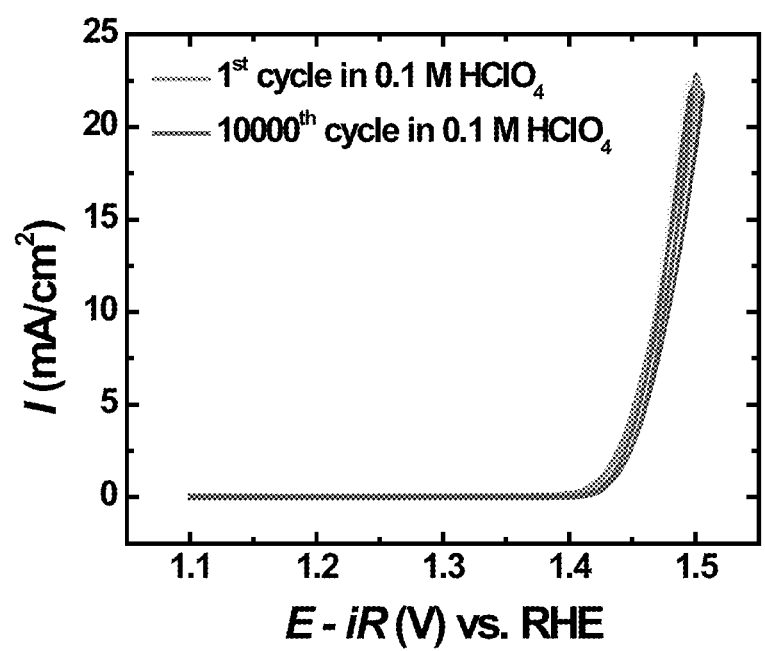
FIG. 6 shows OER data for an exemplary nonporous $Y_2Ru_2O_7$ electrocatalyst catalyst tested up to 10,000 potential cycles in a 0.1 M $HClO_4$ solution, showing exceptional stability and no visible degradation.

Example 5. Electrochemical Testing of Nonporous Y$_2$Ru$_2$O Electrocatalyst in Acidic Media The electrochemical test procedure described above in Example 3 is applicable here. The stability of the nonporous Y$_2$Ru$_2$O$_7$ catalyst is tested up to 10,000 potential cycles, as shown in FIG. 6. The data confirm the high activity and stability of the electrocatalyst without loss of performance in 0.1 M HClO$_4$ solution. Similar or better stability results in terms of number of potential cycles (e.g., up to 10,000 with no loss of performance in acidic media) are expected for porous A$_2$B$_2$O$_n$ electrocatalysts, particularly Y$_2$Ru$_2$O$_7$ and Y$_2$Ir$_2$O$_7$. The pyrochlore electrocatalysts described in this disclosure represent the most stable and highly active (onset potential at about 1.45 V) OER catalysts tested in strong acid (HClO$_4$) for up to 10,000 cycles.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. An electrocatalyst for acidic media, the electrocatalyst comprising:
    a porous metal oxide structure comprising particulate walls separating a plurality of pores, each particulate wall comprising interconnected primary particles,
    wherein the porous metal oxide structure is a phase-pure structure including only a pyrochlore phase of chemical formula A$_2$B$_2$O$_n$, wherein A comprises one or more A-site metals, B comprises one or more B-site metals selected from the group consisting of Ru and Ir, and 6.0≤n≤7.3.

2. The electrocatalyst of claim 1, wherein the one or more A-site metals are selected from the group consisting of Y, Pb, Bi, Tl, Pr, Nd, Sm, Eu, Gd, Tb, Dy, Ho, Er, Tm, Yb, and Lu.

3. The electrocatalyst of claim 2, wherein the A-site metal is Y, the B-site metal is Ru or Ir, n is 7, and the pyrochlore phase is Y$_2$Ru$_2$O$_7$ or Y$_2$Ir$_2$O$_7$.

4. The electrocatalyst of claim 1, wherein the interconnected primary particles are nanocrystalline.

5. The electrocatalyst of claim 1, wherein the pores have an average size in the range from about 5 nm to about 1 micron.

6. The electrocatalyst of 5, wherein the average size of the pores is from about 5 nm to about 200 nm.

7. The electrocatalyst of claim 1 being an oxygen evolution reaction (OER) electrocatalyst.

8. The electrocatalyst of claim 1 further comprising particulate carbon supporting or dispersed in the porous metal oxide structure.

9. The electrocatalyst of claim 8, wherein the particulate carbon comprises one or more of: carbon black, graphite, graphene, graphene oxide, carbon nanotubes, and carbon dots.

10. The electrocatalyst of claim 9, wherein the particulate carbon includes a dopant element.

11. An oxygen evolution reaction (OER) electrocatalyst for acidic media, the OER electrocatalyst comprising:
a metal oxide structure comprising a pyrochlore phase of chemical formula $A_2B_2O_n$, wherein A comprises one or more A-site metals, B comprises one or more B-site metals selected from the group consisting of Ru and Ir, and $6.0 \leq n \leq 7.3$, the metal oxide structure being a phase-pure structure comprising only the pyrochlore phase,
wherein the metal oxide structure exhibits a mass current density of at least about 20 A/g at an over-potential of 0.22 V in an acidic solution comprising 0.1 M $HClO_4$.

12. The OER electrocatalyst of claim 11, wherein the metal oxide structure is stable for at least 1,000 potential cycles in the acidic solution comprising 0.1 M $HClO_4$.

13. The OER electrocatalyst of claim 12, wherein the metal oxide structure is stable for at least 10,000 potential cycles in the acidic solution comprising 0.1 M $HClO_4$.

14. The OER electrocatalyst of claim 11, wherein the metal oxide structure is a porous metal oxide structure comprising particulate walls separating a plurality of pores, each particulate wall comprising interconnected primary particles.

15. The OER electrocatalyst of claim 11, wherein the one or more A-site metals are selected from the group consisting of Y, Pb, Bi, Tl, Pr, Nd, Sm, Eu, Gd, Tb, Dy, Ho, Er, Tm, Yb, and Lu.

16. The electrocatalyst of claim 1, wherein the interconnected primary particles are bonded together at contact regions between adjacent particles.

17. The electrocatalyst of claim 1, wherein the interconnected primary particles comprise single crystalline particles.

18. The electrocatalyst of claim 1, wherein the porous metal oxide structure has a hierarchical porous structure including both microscale and nanoscale porosity.

19. The OER electrocatalyst of claim 11, wherein the one or more A-site metals is Y.

20. The OER electrocatalyst of claim 11, wherein the metal oxide structure has a hierarchical porous structure including both microscale and nanoscale porosity.

* * * * *